United States Patent [19]

Wilson

[11] Patent Number: 4,829,866

[45] Date of Patent: May 16, 1989

[54] METHOD OF REGISTERING FILM POSITIVES OR NEGATIVES/FOILS/MASKS OR FLATS

[75] Inventor: Peter W. Wilson, Balmain, Australia

[73] Assignee: Embassy Litho Plates Pty., Ltd., Lakemba, Australia

[21] Appl. No.: 635,476

[22] Filed: Jul. 30, 1984

Related U.S. Application Data

[63] Continuation of Ser. No. 397,353, Jul. 1, 1982, abandoned, which is a continuation-in-part of Ser. No. 184,972, Sep. 8, 1980, abandoned.

[30] Foreign Application Priority Data

Sep. 10, 1979 [AU] Australia .................. PE-0427/79

[51] Int. Cl.$^4$ .................. B26D 5/08; B26F 1/14
[52] U.S. Cl. .................. 83/560; 83/451; 83/620; 83/639; 83/691

[58] Field of Search .................. 83/691, 684, 33, 451, 83/513, 816, 517, 519, 560, 618, 620, 498, 13, 639

[56] References Cited

U.S. PATENT DOCUMENTS

| | | | |
|---|---|---|---|
| 1,634,752 | 7/1927 | Lautenschlager | 83/691 |
| 3,152,505 | 10/1964 | Alldis | 83/468 |
| 3,198,047 | 8/1965 | Munz | 83/33 |
| 3,290,975 | 12/1966 | Caesar | 83/33 |
| 3,524,372 | 8/1970 | Albrecht | 83/451 |
| 3,863,534 | 2/1975 | Scott | 83/691 |

*Primary Examiner*—Frank T. Yost
*Assistant Examiner*—Rinaldi Rada
*Attorney, Agent, or Firm*—Cushman, Darby & Cushman

[57] ABSTRACT

A combined pre-press punch for simultaneously punching a symmetrical configuration for film sheet bearing a fixed relationship with desired plate punch configurations and having a floating back punch symmetrically disposed relative to the symmetrical punching configuration.

5 Claims, 2 Drawing Sheets

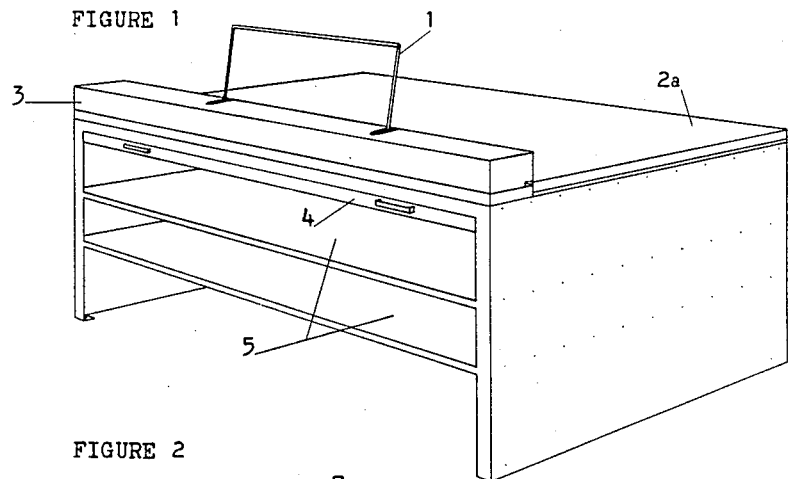
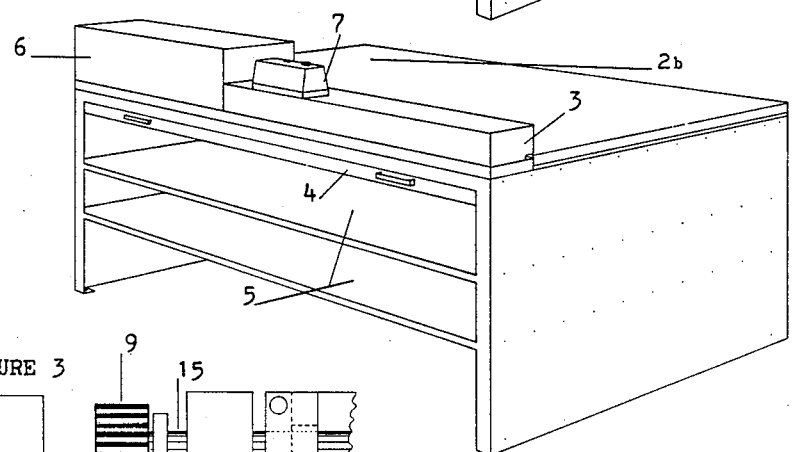
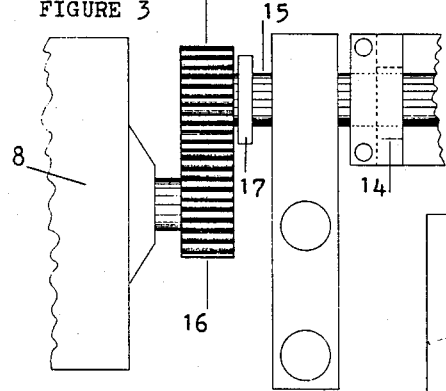
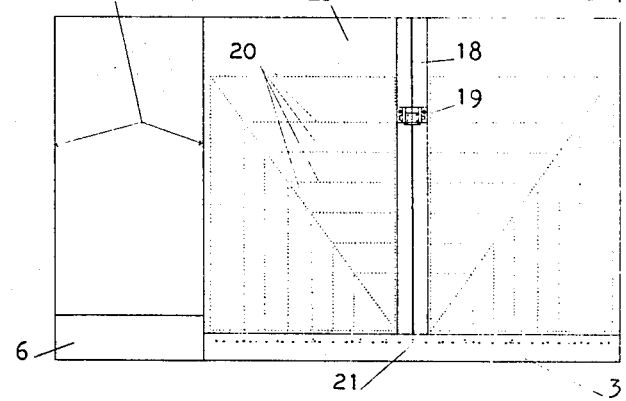

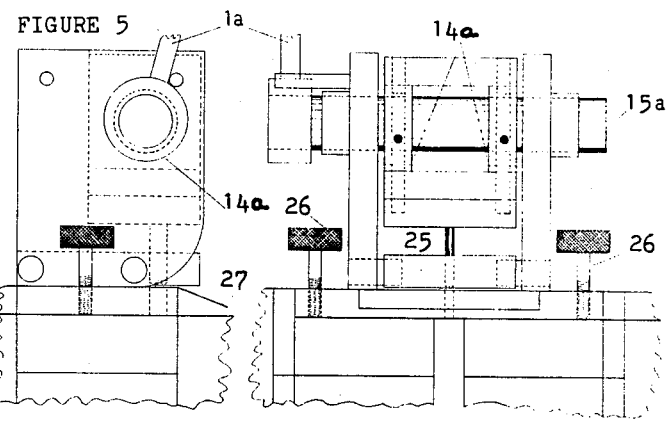
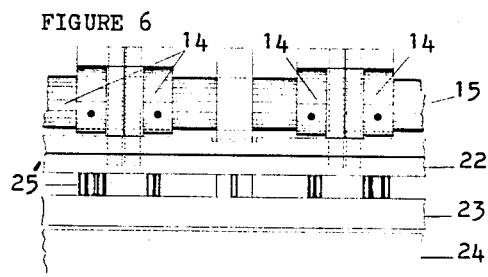
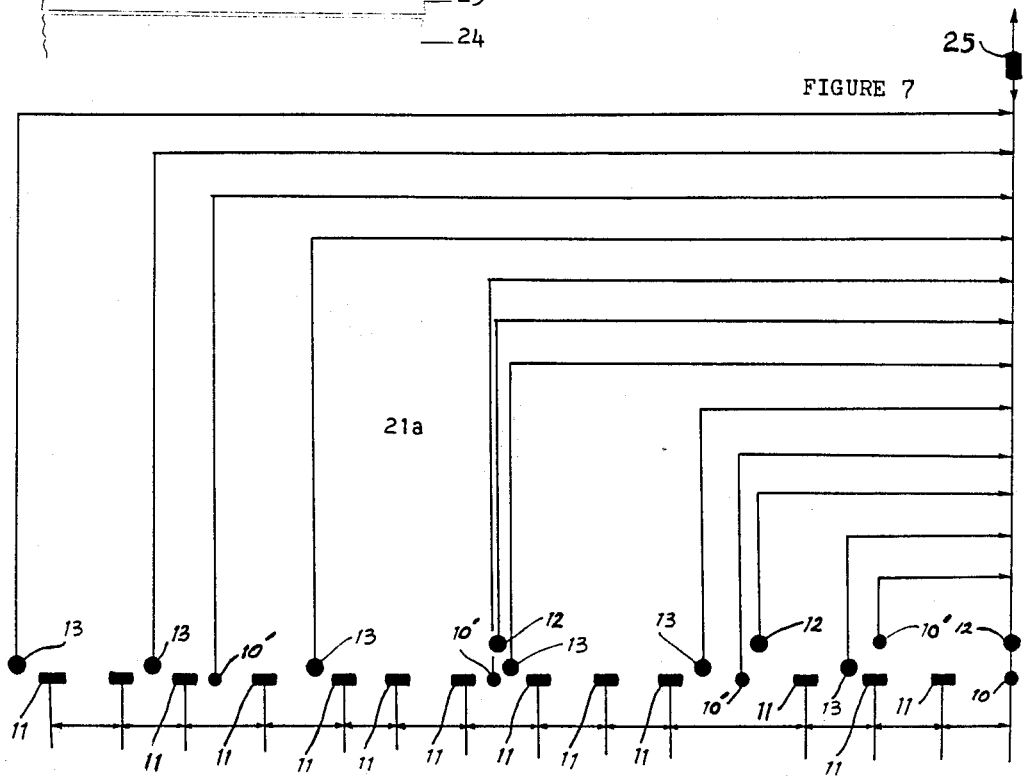

METHOD OF REGISTERING FILM POSITIVES OR NEGATIVES/FOILS/MASKS OR FLATS

This is a continuation of application Ser. No. 397,353, filed July 1, 1982 (now abandoned), as a continuation-in-part of application Ser. No. 184,972, filed Sept. 8, 1980 (now abandoned).

The present invention relates to printing and in particular to a method of improving pre-press registration between films and plates during the production of those plates.

The need for consistent registration is most marked where full colour printing is required as each of four plates must have their printing surfaces in precise register with each other to avoid colour overprinting at the edges of colour boundaries and so provide poor boundary definition on the resultant colour printed sheet.

The difficult problems of registration are discussed in Australian Patent Nos. 404,967 and 462,212 and the disclosures of those patents are incorporated herein by reference.

In the process of producing offset printing plates, several complex steps have to be undertaken to arrive at a single sheet of film, per colour to be printed, which is then exposed direct to the printing plate.

In general the steps are as follows:

1. A line negative is photographed from base artwork to the desired size.

2. Four colour separations are produced by either camera, enlarger or electronic scanning techniques and are supplied in single sheet form per colour to the relevant size of reproduction required, either from colour transparency, colour prints or hard copy.

3. Using a predetermined layout as a guide, a sheet of clear film is placed on a graph and a rule up is done. Register marks, centre marks, trim, fold and perforation marks are added, this step is done due to the need to have the job exactly to correct size and square.

4. The line negatives are positioned on another sheet of clear film which has been punches to the same configuration as the rule up, this allows register pins to hold each sheet in perfect register with each other.

5. If the job requires reverses, a sheet of light restraining paper is punched, relevant reverses cut out of paper and this line negative with paper mask registered by the pin register system is then contacted in a vacuum contact frame onto a sheet of film (unexposed) that has also been punched and is held in position by register pins during exposure. This exposed film is then developed either manually or through an automatic film processor.

6. Where colour shots butt up to other colour shots or where tints of colour meet, chokes and spreads have to be produced to allow a degree of fit when making up final film. In normal work screens with a line ruling of 150 lines to the inch are used, sometimes 200 lines to the inch and fit is only one line of dots.

7. Masks are cut manually using a material that when the emulsion is cut with a sharp blade, it can be peeled off from its clear film base.

8. Final film is produced manually b making multiple exposures onto photographic film to produce a final sheet of film that contains all the required elements, including four colour pics, tints, reverses, chokes, spreads, line copy and centre, trim, fold and perforation marks.

9. Final film (in the case of four colour process) are then proofed, either by chemical proofing methods or plates are made and ink proofs done.

In the multitude of sub straights or "flats", it may require many exposures to produce one final negative or positive, depending on the complexity of the particular job. It is, therefore, vitally important that the registration of these various components be absolute. This is why a punch register system is used. Punch register systems can take many forms and have various punch hole configurations.

Most punch register systems available for use in the dark room, or pre plate area, work on the principle of using a round hole (or a series of round holes) on one side and a slotted hole on the other side of a central position. These systems are not ideal, because when a register pin is placed in the round hole, optimum registration takes place on and from that round pin and any variation occurs towards the slotted pin as the flat is pulled down in contact under vacuum. This fault is amplified by the variety of substraight ("flats") materials used in the process. Each material, either paper, clear film, photographic film, rubylith etc. all have their own dimensional stability problems, each being effected by temperature and humidity in various ways. Therefore the present invention provides a punch that works from a round hole in the centre, with slotted holes to both left and right to allow any shift in registration to move equally from centre.

An additional problem is that while registration is obtained along the punching side of the film/materials (normally the longest side) there is no control over registration on the shorter side. Therefore the present invention provides a floating pin/punch. This additional punch may be slid down a track, which is at 90° to the front punching function, and is independant of the main punch action. The action in total is as follows. The material to be punched is placed in the punch knocking up to a back stop, the main punch is operated, say, by depressing a handle, a locking or pressure bar precedes the cutters to hold the film flat across the punching head, the material is punched and the cutters lock the punched material into the dies, the portable or floating pin unit is then moved to the desired position to accommodate the film size being used, a single hole is then punched, preferably a slot hole. The punched film is then placed into a vacuum contact frame and registration pins are placed through the holes, the flat is placed over the film and located by the pins, a cover sheet is placed over and a vacuum applied so that when perfect contact is achieved, an exposure is made. This exposure process is repeated as many times as required depending on the number of flats to achieve the final result, all of these flats are located by the register pins protruding through the film. The completed, exposed film is then processed. These procedures are repeated for as many colours as are to be printed.

It might be thought that the foregoing procedure provides precise registration however further difficulties arise. Printing machines are in use having different punch registration systems fitted to their plate cylinder or plate clamp bar, in the case of Web presses their plate bender, to locate the plate in the correct position while the positioning of the plate is of paramount importance if the image or plate is not correctly in its position much time and materials are wasted.

To tie the final film into the same punching system that appears on a particular printing press requires a carrier. Mellanex or similar material is punched using the particular machine punch system. A line is drawn on the carrier to indicate grip edge folds and double cuts. The negatives are taped to this carrier reading wrong emulsion up. The carrier is turned over and a piece is cut out of the carrier to expose the holes in the punched film and a portable hole or tab is either taped to the back of the carrier or is affixed by double side tape.

Once this has been done the negatives or positives can be removed and all negatives or positives that have been produced using a constant punching configuration can be taped to the carrier and plates can be made, changing each negative after exposure to plate and replacing the next negative on the carrier using register pins to locate each negative in the same position on the carrier. The latter process not only involves a great deal aof time but also creates another process or step tht could adversely effect the register of the final image or plate; involves an extra surface for dust and scratches to form and if the job comes back at any time in the future for a remake or alteration to any less than the complete set of plates, no real confidence could be afforded to the carrier system due to temperature/humidity variations that could have effected the positioning of the tabs or holes on the carrier sheet.

In accordance with the present invention there is provided a pre-press punch comprising a symmetrical pre-press punching configuration having at least a central round hole punch along one edge and at least one slotted hole punch spaced on opposite sides of said central punch and equally spaced from the central punch along said one edge, a floating punch movable perpindicular to said one edge and disposed symmetrically relative to said central punch and said slotted punches, and further comprising plate punching means operable in unison with the operation of said pre-press punches along said one edge.

By this means final film can be produced which is punches to the same register configuration as on the printing press. The application of common punching configurations so as to produce punched film, punched proofs to coincide with the plate configuration greatly facilitates the checking of the relative position of the image before it goes to press; the edge of a proof is the same as the edge of its respective plate.

Further, symmetrical punching allows double sided proofs to be positioned with great accuracy.

The present invention will now be described by way of example with reference to the accompanying drawings, in which:

FIG. 1 is a perspective view of a hand operated punch apparatus of the type suited for carrying out the present invention;

FIG. 2 is a perspective view of a power assisted punch apparatus being a modification of the apparatus of FIG. 1;

FIG. 3 is a plan view of the motor to drive shaft connection of the apparatus of FIG. 2;

FIG. 4 is a plan view of the base top of the apparatus of FIG. 1 and FIG. 2;

FIG. 5 one side and front elevation views of the back stop punch of the apparatus of FIGS. 1 or 2;

FIG. 6 is a front elevation view of a portion of the main punch operation of the apparatus of FIGS. 1 or 2; and FIG. 7 is a magnified view of the left habd side detail of the main punch configuration as shown in FIG. 4.

Referring to the drawings and in particular FIG. 1 and which show punching apparatus for carrying out the requirements of this invention. Throughout the drawings like parts are denoted by the same reference numerals.

The punching apparatus of FIGS. 1 and 2 include a table top 2a upon which the film material to be punched is placed. The main punches (not shown) are housed within punch head cover 3 and the punched out portions of film called slugs fall onto collection tray 4. Storage shelves 5 are provided for convenience of users. In the apparatus of FIG. 2 the base top portion 2b is an additional table top area providing free space on the motorised embodiment. The drive motor (not shown) is provided within housing 6 and controlled by switch 7.

FIG. 3 shows the connection of motor 8 to drive shaft 15 via motor drive gear 16 and main shaft gear 9. Micro switch trip sleeve 17 functions to switch off motor 8 upon completion of a full rotation of shaft 15.

The table top area of FIG. 4 is of the apparatus of FIG. 2 as it includes the additional table top area 2b whereas that of FIG. 1 has the appearance of FIG. 4 without area 2b. Back stop punch track 18 guides the movement of back stop punch 19. Vacuum holes 20 which are coupled to a suction system (not shown) which functions in a well known manner as will be understood by the addressee. The vacuum drawn down firmly retains the sheet to be punched at a defined position during the punching operation. The punching configuration 21 of the main punches within cover 3 are shown in more detail in FIG. 7.

The back stop punch 19 is shown in more detail in FIG. 5 and includes an operating handle 1a which rotates shaft 15a and off centred cams 14a which are mounted thereon. The off centred cams 14a contact plate members above punch 25 which drive punch 25 through the film to be punched. Thumb screws 26 lock the back stop punch 19 at its required position along track 18 before operation of the punch by lever 1a. Film guide 27 guides the film to be punched beneath punch 25 as the punch is positioned ready for use.

The portion of the main punch shown in FIG. 6 is similar to the elements of the back stop punch 19 in that it operates by rotation of cams 14 on shaft 15, which cams move striker plates 22 and hence punches 25' downwardly through a film inserted between stripper plate 23 and base plate 24. Rotation of shaft 15 being achieved by handle 1 in the case of FIG. 1 or motor 8 in the case of FIG. 2.

The punching configuration shown in FIG. 7 is the left hand side of the main punch configuration of FIG. 4. The mirror reverse of FIG. 7 represents the right hand side of the symmetrical punch configuration of FIG. 4.

As shown in FIG. 7 the central round hole 10 in association with the slotted holes 11 provided each side of the centre hole 10 provide for even expansion and contraction either side of the central position. In addition adjustable back slot 25a formed by punch 25 allows for film expansion and contraction in a direction transverse to that of the front edge slots 11. The remaining punch holes 10', 12 and 13 coincide with varying punch systems which are formed by the configuration punching means simultaneously with holes 10, 11.

I claim:

1. A pre-press punch comprising a symmetrical pre-press punching configuration having at least a central round hole punch along one edge and at least one slotted hole punch along one edge and at least one slotted hole punch spaced on opposite sides of said central punch and equally spaced from said central punch along said one edge, a floating punch movable perpendicular to said one edge and disposed symmetrically relative to said central punch and said slotted punches, and further comprising plate configuration punching means operable in unison with the operation of said pre-press punches along said one edge.

2. A pre-press punch as claimed in claim 1 having manual operating means.

3. A pre-press punch as claimed in claim 1 having power assisted operating means.

4. A pre-press punch as claimed in claim 1 comprising vacuum operated draw down means.

5. A pre-press punch as claimed in claim 1 having a plurality of slotted hole punches spaced aprt along said one edge either side of said central round hole punch.

* * * * *